(12) United States Patent
Araki et al.

(10) Patent No.: US 7,069,065 B2
(45) Date of Patent: Jun. 27, 2006

(54) SUPERCONDUCTOR LAYER AND METHOD OF MANUFACTURING THE SAME

(75) Inventors: Takeshi Araki, Nagoya (JP); Toshiharu Niwa, Nagoya (JP); Takemi Muroga, Nagoya (JP); Yutaka Yamada, Nagoya (JP); Izumi Hirabayashi, Nagoya (JP)

(73) Assignees: Kabushiki Kaisha Toshiba, Tokyo (JP); Chubu Electric Power Co., Inc., Nagoya (JP); Hitachi Cable Ltd., Tokyo (JP); International Superconductivity Technology Center, Tokyo (JP)

( * ) Notice: Subject to any disclaimer, the term of this patent is extended or adjusted under 35 U.S.C. 154(b) by 0 days.

(21) Appl. No.: 10/819,258

(22) Filed: Apr. 7, 2004

(65) Prior Publication Data

US 2004/0192559 A1 Sep. 30, 2004

Related U.S. Application Data

(63) Continuation of application No. PCT/JP03/02577, filed on Mar. 5, 2003.

(30) Foreign Application Priority Data

Mar. 5, 2002 (JP) .............................. 2002-059398

(51) Int. Cl.
*H01B 12/00* (2006.01)
*H01F 6/00* (2006.01)
*H01L 39/00* (2006.01)
*C04B 35/45* (2006.01)

(52) U.S. Cl. ....................... 505/230; 505/126; 428/702
(58) Field of Classification Search ................ 505/125, 505/126, 230–239, 777, 779; 428/697, 702; 174/125.1
See application file for complete search history.

(56) References Cited

U.S. PATENT DOCUMENTS

| 5,817,172 | A | * | 10/1998 | Yamada et al. ................ 117/41 |
| 6,586,042 | B1 | | 7/2003 | Araki et al. |
| 6,797,313 | B1 | * | 9/2004 | Fritzemeier et al. .......... 427/62 |
| 2002/0086799 | A1 | | 7/2002 | Araki et al. |
| 2003/0198748 | A1 | | 10/2003 | Araki et al. |

FOREIGN PATENT DOCUMENTS

| EP | 1187231 A2 * | 3/2002 |
| JP | 2002-505032 | 2/2002 |
| JP | 2002-080297 | 3/2002 |
| WO | WO 98/58415 | 12/1998 |
| WO | WO 01/08235 A1 | 2/2001 |
| WO | WO 01/11428 A1 | 2/2001 |

OTHER PUBLICATIONS

McIntyre, P.C. et al., "Effect of Growth Conditions on the Properties and Morphology of Chemically Derived Epitaxial Thin Films of $Ba_2YCu_3O_{7-x}$ on (001) $LaAlO_3$", J. Appl. Phys., vol. 71, No. 4, pp. 1868-1877, (Feb. 15, 1992).

McIntyre, P. C. et al., "Microstructural Inhomogeneities in Chemically Derived $Ba_2YCu_3O_{7-x}$ Thin Films: Implications for Flux Pinning", J. Mater. Res., vol. 9, No. 11, pp. 2778-2788, (Nov. 1994).

Araki, T. et al., "Growth Model and the Effect of CuO Nanocrystallites on the Properties of Chemically Derived Epitaxial Thin Films of $YBa_2Cu_3O_{7-x}$,", Journal of Applied Physics, vol. 92, No. 6, pp. 3318-3325, (Sep. 15, 2002).

Araki, T. et al., "Fabrication of $YBa_2Cu_3O_{7-x}$ Film by Metalorganic Deposition Method Using Trifluoroacetates and Its Process Conditions", Cryogenics, vol. 41, pp. 675-681, (2001).

McIntyre, P. C. et al., "Metal-Organic Decomposition and Microstructure Development in $Ba_2YCu_3O_{7-x}$ Films From Metal Trifluoroacetate Precursors", Mat. Res. Soc. Symp. Proc., vol. 169, pp. 743-746, (1990).

(Continued)

*Primary Examiner*—Colleen P. Cooke
(74) *Attorney, Agent, or Firm*—Finnegan, Henderson, Farabow, Garrett & Dunner, L.L.P.

(57) ABSTRACT

There is provided is a method of manufacturing a superconductor layer, including preparing a coating solution by dissolving trifluoroacetates of at least one metal selected from the group consisting of yttrium and lanthanoids, barium, and copper in a solvent, coating a main surface of a substrate with the coating solution to form a coating film, subjecting the coating film to a calcining process in an atmosphere containing oxygen, and subjecting the coating film after the calcining process to a firing process in an atmosphere containing water vapor at a temperature higher than that at the calcining process. The calcining process is carried out such that the coating film after the calcining process and before the firing process have an average CuO particle diameter equal to or less than 25 nm.

8 Claims, 8 Drawing Sheets

OTHER PUBLICATIONS

Araki, T. et al., "Coating Processes for $YBa_2Cu_3O_{7-x}$ Superconductor by Metalorganic Deposition Method Using Trifluoroacetates", Supercond. Sci. Technol., vol. 14, pp. 783-786, (2001).

Araki, T. et al., "Large-Area Uniform Ultrahigh-$J_c$ $YBa_2Cu_3O_{7-x}$ Film Fabricated by the Metalorganic Deposition Method Using Trifluoroacetates", Supercond. Sci. Technol., vol. 14, pp. L21-L24, (2001).

* cited by examiner

SUPERCONDUCTOR LAYER AND METHOD OF MANUFACTURING THE SAME

CROSS-REFERENCE TO RELATED APPLICATIONS

This is a Continuation Application of PCT Application No. PCT/JP03/02577, filed Mar. 5, 2003, which was not published under PCT Article 21(2) in English.

This application is based upon and claims the benefit of priority from prior Japanese Patent Application No. 2002-059398, filed Mar. 5, 2002, the entire contents of which are incorporated herein by reference.

BACKGROUND OF THE INVENTION

1. Field of the Invention

The present invention relates to a superconductor layer and a method of manufacturing the same, particularly, to a superconductor layer containing oxide superconductor and a method of manufacturing the same.

2. Description of the Related Art

Oxide superconductors with high critical current density are expected to be used in, for example, a fusion reactor, a magnetically levitated train, an accelerator and a magnetic resonance imaging (MRI) apparatus, and have already been put to a practical use in some fields. Oxide superconductors include, for example, bismuth series oxide superconductors and yttrium series oxide superconductors. Particularly, yttrium series oxide superconductors exhibit satisfactory characteristics within a magnetic field and, thus, attract keen attentions as a material that is closest to the practical use.

A superconductor layer made of yttrium series superconductor can be manufactured by, for example, a pulsed laser deposition (PLD) method, a liquid-phase epitaxy (LPE) method, or an electron beam (EB) method. In recent years, a metal-organic deposition (MOD) method, which can be performed in a non-vacuum atmosphere and permits a low manufacturing cost, attracts attention, and vigorous research is being made on the MOD method mainly in the United States of America. Particularly, good properties are repeatedly reported in respect of the MOD method using a fluoroacetate such as trifluoroacetate (TFA), which is hereinafter referred to as TFA-MOD method.

According to the TFA-MOD method, a superconductor layer is formed by the following manner. First, trifluoroacetates of metals that constitute the superconductor are prepared by using trifluoroacetate and aqueous solutions of metal acetates, followed by dissolving the trifluoroacetate of metals in an organic solvent to obtain a coating solution. Then, a substrate is coated with the coating solution to obtain a coating film, and the coating film thus obtained is subjected to a calcining process in a humidified oxygen atmosphere so as to form a precursor that contains elements to be used as constituents of oxide superconductor. Further, the coating film is subjected to a firing process in a humidified atmosphere so as to bring about crystallization of the precursor. In other words, crystals of oxide superconductor are allowed to grow on the substrate. Thereafter, an annealing in an oxygen atmosphere is performed. A superconductor layer is formed by the process described above.

According to the method described above, it is possible to easily obtain a superconductor layer exhibiting a high critical current density $J_c$. However, the present inventors are of the opinion that the TFA-MOD method is capable of achieving a still higher critical current density $J_c$.

BRIEF SUMMARY OF THE INVENTION

An object of the present invention, which has been achieved in view of the problems pointed out above, is to make it possible to manufacture a superconductor layer with higher critical current density by the TFA-MOD method.

According to a first aspect of the present invention, there is provided a superconductor layer formed on a main surface of a substrate, comprising an oxide superconductor that contains at least one metal selected from the group consisting of yttrium and lanthanoids, barium, copper and oxygen, wherein, when a cross section of the superconductor layer that is parallel with the main surface and spaced apart from the main surface by 50 nm to 70% of a thickness of the superconductor layer is observed, an area ratio of copper oxide particles to the superconductor layer is 1/100 or less.

According to a second aspect of the present invention, there is provided a method of manufacturing a superconductor layer, comprising preparing a coating solution by dissolving trifluoroacetates of at least one metal selected from the group consisting of yttrium and lanthanoids, barium, and copper in a solvent, coating a main surface of a substrate with the coating solution to form a coating film, subjecting the coating film to a calcining process in an atmosphere containing oxygen, and subjecting the coating film after the calcining process to a firing process in an atmosphere containing water vapor at a temperature higher than that at the calcining process, wherein the calcining process is carried out such that the coating film after the calcining process and before the firing process have an average CuO particle diameter equal to or less than 25 nm.

According to a third aspect of the present invention, there is provided a method of manufacturing a superconductor layer, comprising preparing a coating solution by dissolving trifluoroacetates of at least one metal selected from the group consisting of yttrium and lanthanoids, barium, and copper in a solvent, coating a main surface of a substrate with the coating solution to form a coating film, subjecting the coating film to a calcining process in an atmosphere containing oxygen, and subjecting the coating film after the calcining process to a firing process in an atmosphere containing water vapor at a temperature higher than that at the calcining process, wherein the calcining process includes elevating a temperature of the coating film in an atmosphere of the atmospheric pressure containing water vapor such that a maximum temperature that the coating film reaches is 400° C. or higher, and that, during the temperature elevation, a period that the temperature of the coating film is kept at 200° C. to 250° C. falls within a range of 6 hours and 15 minutes to 16 hours and 30 minutes.

DETAILED DESCRIPTION OF THE INVENTION

Embodiments of the present invention will now be described with reference to the accompanying drawings.

Figure 1:
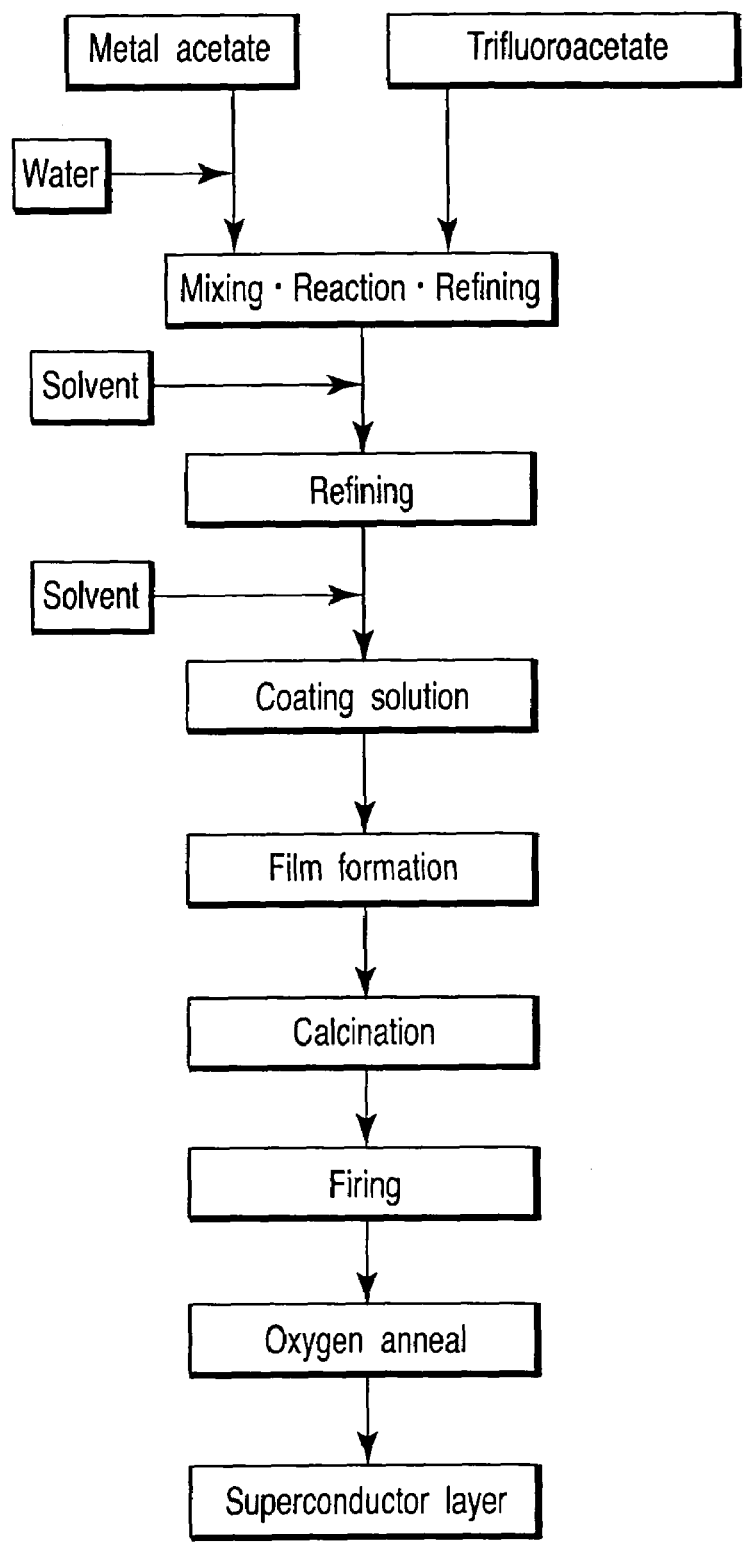
FIG. 1 is a flow chart showing the manufacturing process of a superconductor layer according to an embodiment of the present invention.

FIG. 1 is a flow chart showing the manufacturing process of a superconductor layer according to an embodiment of the present invention. In the present embodiment, the superconductor layer is manufactured by the method described below.

First, acetate of yttrium and/or lanthanoids, barium acetate and copper acetate are prepared. Then, each of these acetates is dissolved in water so as to obtain aqueous solutions of acetates. Further, trifluoroacetate is mixed with each aqueous solution of acetate in a mixing ratio substantially corresponding to the stoichiometric ratio, e.g., within an error range of ±5% relative to the stoichiometric ratio, followed by further mixing the aqueous solutions of acetates such that a molar ratio of yttrium and/or lanthanoids, barium and copper is adjusted to 1:2:3 or so. Then, an ion exchange between the acetate ions and the trifluoroacetate ions is promoted within the mixed solution. Further, the trifluoroacetate, which is obtained as a result of the ion exchange reaction, is refined.

Next, the refined trifluoroacetate is dissolved in a suitable solvent to prepare a coating solution, followed by coating a substrate with the coating solution to obtain a coating film.

The coating film thus obtained is calcined in an atmosphere containing water vapor and oxygen, preferably, in a humidified pure oxygen atmosphere. In the calcining process, a decomposition reaction such as the hydrolysis of the trifluoroacetate is brought about so as to permit the decomposition products containing the constituent elements of the trifluoroacetate to evaporate from the coating film. At the same time, oxygen is supplied into the coating film to generate a precursor of oxide superconductor. Incidentally, in the case of using a highly purified solution, it is possible to decompose trifluoroacetate without sublimation of $Cu(TFA)_2$ even if the reaction system is not humidified, as disclosed in T. Araki, Cryogenics 41, 675 (2001). Also, the precursor obtained by the calcining process is mainly made of an amorphous matrix containing the constituent elements of oxide superconductor and CuO microcrystals (or CuO particles) distributed therein.

After the calcining process, the coating film is subjected to the firing process in an atmosphere containing water vapor, preferably in an inert gas atmosphere containing water vapor and a trace of oxygen, followed by annealing the coating film in an oxygen atmosphere. In the firing process, the precursor prepared by the calcining process is crystallized to form an oxide superconductor, thereby obtaining a superconductor layer.

In the present embodiment, the calcining process is carried out such that CuO in the calcined film has an average particle diameter not larger than a prescribed value. The particular method makes it possible to achieve a high critical current density, as described in the following.

$Cu(TFA)_2$ used in the TFA-MOD method sublimes when heated to a high temperature. Therefore, in the method, the calcining process at a relatively low temperature in a humidified oxygen atmosphere is carried out prior to the firing process so as to suppress the sublimation referred to above. Incidentally, in the calcining process, $Cu(TFA)_2$ is partial-hydrolyzed so as to be converted into $Cu(TFA)OH$ and, then, further decomposed into CuO, as described in McIntryre, et al., Proc. Mat. Res. Soc. Symp. 169. 743 (1990). Also, the other trifluoroacetates are decomposed at temperatures higher than the decomposition temperature of $Cu(TFA)_2$. Therefore, the precursor formed by the calcining process is mainly made of the amorphous matrix containing the metal, O and F, and CuO microcrystals (or CuO particles) distributed therein, as disclosed in T. Araki, et al., Supercond. Sci. Technol. 14, 783 (2001).

The present inventors have found that the critical current density $J_c$ is affected by CuO microcrystals produced within the precursor and the impurities contained in the precursor. It is possible to eliminate the influences of the impurities on the critical current density $J_c$ by increasing the purity of the solutions noted above, as disclosed in T. Araki, et al., Supercond. Sci. Technol. 14, L21 (2001). However, the CuO microcrystals are produced as a result of the hydrolysis and oxidation of $Cu(TFA)_2$ as described above. Suppression of the influences by the CuO microcrystals is particularly important to improve the critical current density $J_c$.

As described above, the calcined film is mainly made of the amorphous matrix containing the constituent elements of oxide superconductor and CuO particles distributed therein. The present inventors believe that the precursor containing the amorphous matrix and the CuO particles is converted during the firing process into oxide superconductor through the quasi-liquid phase. Also, previous researches demonstrate that water vapor is necessary for producing the quasi-liquid phase, the quasi-liquid phase releases hydrogen fluoride when converted into oxide superconductor, and the reaction to produce oxide superconductor from the precursor is reversible. Therefore, the reaction to form oxide superconductor from the precursor is presumed as follows:

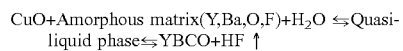

$$CuO + \text{Amorphous matrix}(Y,Ba,O,F) + H_2O \leftrightarrows \text{Quasi-liquid phase} \leftrightarrows YBCO + HF \uparrow$$

The reaction formula given above indicates that, if the $H_2O$ content of the atmosphere is increased without changing temperature, the copper constituting the CuO particles in the precursor can be used for the formation of the quasi-liquid phase. Therefore, it is possible to decrease the amount of the CuO particles. In other words, it is possible to decrease the amount of the microcrystals in the superconductor layer so as to realize a high critical current density $J_c$. However, it is practically impossible to markedly increase the critical current density $J_c$ by simply increasing the amount of humidity during the firing process.

The present inventors considered that the diameter of the CuO particles within the precursor is important for the property, established first the control method of the particle diameter of the CuO particles within the precursor, and investigated the relationship between the particle diameter of the CuO particles and the critical current density $J_c$. As a result, it has been confirmed that, where the average diameter of the CuO particles within the precursor is set at 25 nm or less, it is possible to realize a high critical current density $J_c$ if the firing process is carried out in a sufficiently humidified atmosphere.

Figure 2A:
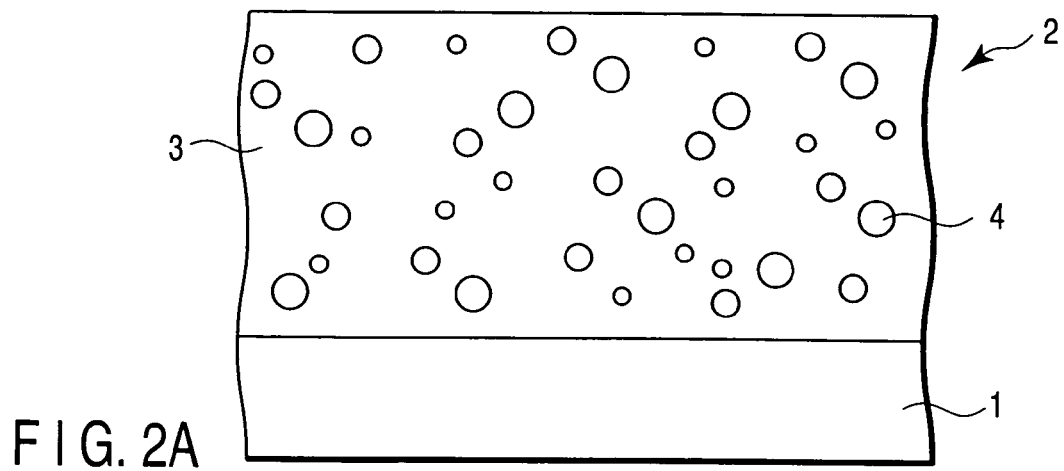
FIGS. 2A to 2C schematically show the reaction during the firing process included in the manufacturing process of a superconductor layer according to an embodiment of the present invention.
Figure 2B:
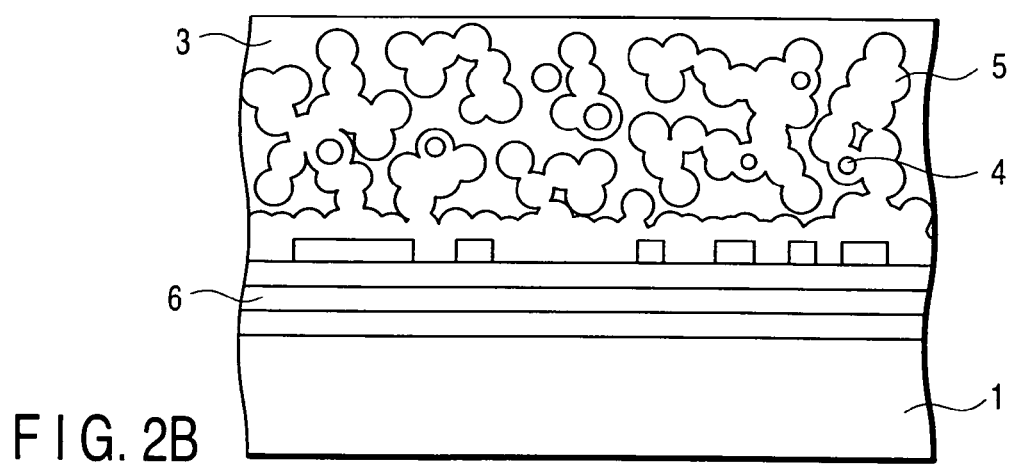
Figure 2C:
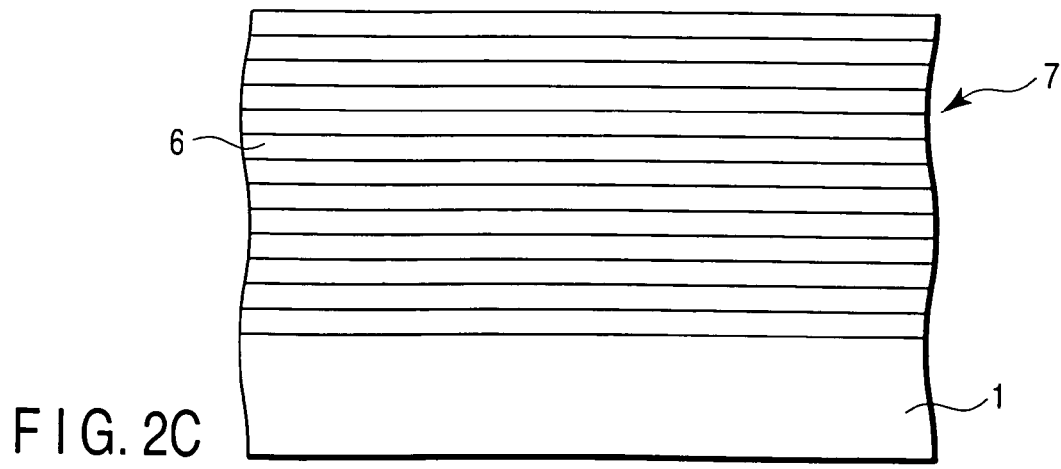
Figure 3A:
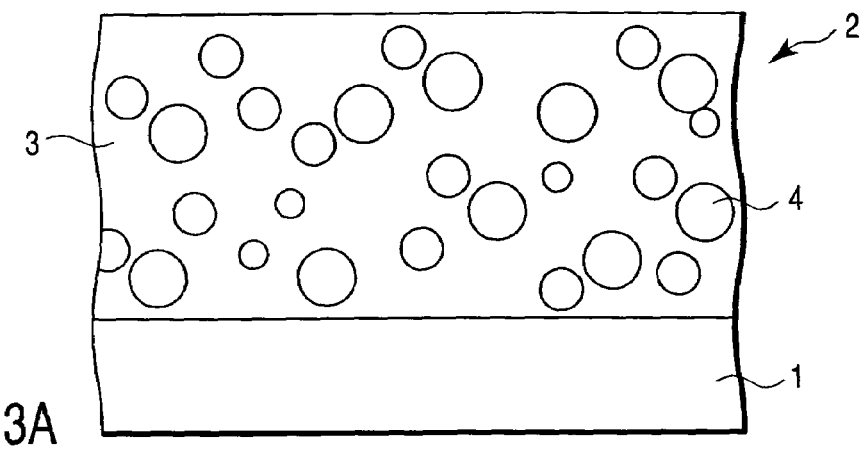
FIGS. 3A to 3C schematically show the reaction during the firing process included in the conventional manufacturing process of a superconductor layer.
Figure 3B:
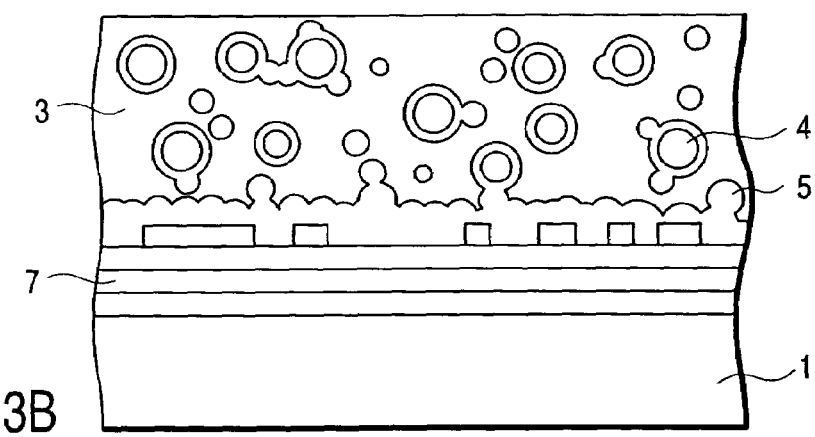
Figure 3C:
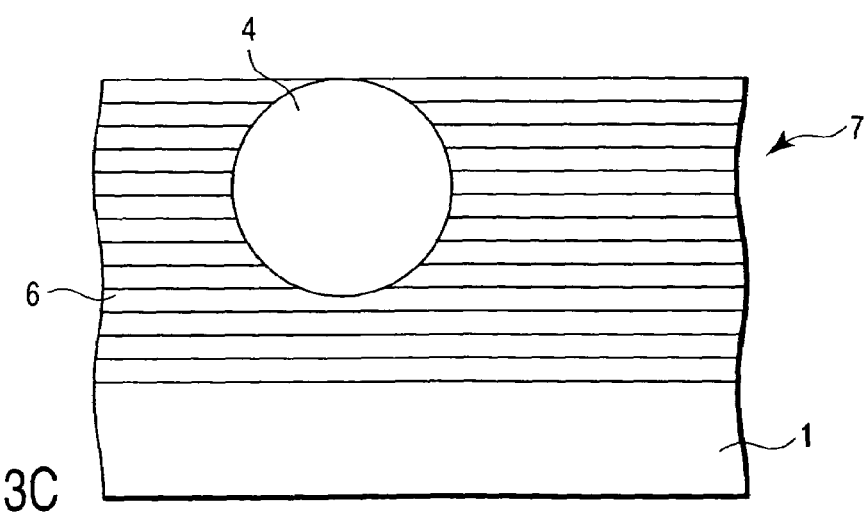

FIGS. 2A to 2C schematically show the reaction during the firing process included in the manufacturing process of the superconductor layer according to an embodiment of the present invention. Also, FIGS. 3A to 3C schematically show the reaction during the firing process included in the conventional manufacturing process of the superconductor layer. Incidentally, each of FIGS. 2A and 3A shows the calcined coating film. Each of FIGS. 2B and 3B shows the coating film during the firing process. Further, each of FIGS. 2C and 3C shows the superconductor layer obtained after the firing process.

As shown in FIGS. 2A and 3A, the calcined coating film (precursor) 2 on a substrate 1 is mainly made of an amorphous matrix 3 and CuO particles 4.

As shown in FIG. 3A, the CuO particles 4 in the calcined coating film 2 have a large average diameter and a small specific surface area. Therefore, it is difficult to convert whole the CuO particle into the quasi-liquid phase 5 during the firing process, as shown in FIG. 3B. Consequently, a large amount of CuO particles 4 having a large average particle diameter remain in a superconductor layer 7 together with an oxide superconductor 6, as shown in FIG. 3C, resulting in poor critical current density $J_c$.

On the other hand, the CuO particles 4 in the calcined coating film 2 have a small average particle diameter and a large specific surface area. Therefore, it is possible to covert almost all the CuO particles into the quasi-liquid phase 5, as shown in FIG. 2B. Consequently, it is possible to prevent the CuO particles 4 from remaining within the superconductor layer 7 as shown in FIG. 2C so as to be able to realize a high critical current density $J_c$.

In the present embodiment, the calcining process is carried out such that the CuO particles within the precursor have an average diameter of 25 nm or less, as described previously. If the CuO particles within the precursor have a smaller average particle diameter, the CuO particles can be converted more easily into the quasi-liquid phase 5 during the firing process. However, where the calcining process is carried out under the condition which makes the average particle diameter of the CuO particles very small, it is difficult in some cases to sufficiently decompose the trifluoroacetate. In such cases, in order to sufficiently decompose the trifluoroacetate, the calcining process may be carried out such that the CuO particles within the precursor have an average diameter of 8.8 nm or larger.

In the present embodiment, at least one kind of the metal selected from the group including yttrium and lanthanoids, barium and copper are contained in the oxide superconductor 6. Any kind of lanthanoid metal can be used. However, in view of facilitating the preparation of the acetate solution and the trifluoroacetate solution, it is advantageous to use at least one kind of metal selected from the group including samarium, europium, gadolinium, terbium, dysprosium, holmium, erbium, and thulium.

In the present embodiment, it is desirable to carry out the firing process in an atmosphere containing water vapor in an amount of at least 4.2% by volume. More desirably, the firing process should be carried out in an atmosphere containing at least 12.1% by volume of water vapor. Also, it is possible to carry out the firing process in an atmosphere containing at least 31.2% by volume of water vapor. The effect of promoting the formation of the quasi-liquid phase 5 is improved by increasing the humidifying amount in the firing process.

In the present embodiment, it is desirable to use the trifluoroacetate having the impurity content not higher than 6% by mass. In the case of using a coating solution containing a large amount of acetates such as barium acetate or yttrium acetate as the impurities, it is possible for particles of oxides of Y or Ba to be formed within the superconductor layer 7.

In the present embodiment, it is desirable for the solvent used for preparation of the coating solution to contain at least one of methanol and ethanol in an amount of at least 50% by mass. In the case of using such a solvent, it is possible to permit the solvent to be evaporated promptly from the coated film.

In the present embodiment, when the calcining process is carried out in an atmosphere of the atmospheric pressure containing water vapor, it is desirable that the period during which the coating film is kept at 200° C. to 250° C. in the stage of elevating the temperature of the coating film falls within a range of 6 hours and 15 minutes to 16 hours and 30 minutes. In this case, it is possible for the decomposition reaction of trifluoroacetate to sufficiently proceed, and it is possible to sufficiently suppress the growth of the CuO particles. It is also desirable for the highest temperature during the calcining process to reach about 300 to 500° C., more preferably, 400° C. or higher. In this case, it is possible for the decomposition products of trifluoroacetate to promptly evaporate from the coating film, which is advantageous in suppressing the growth of the CuO particles.

In the present embodiment, it is desirable for the highest temperature during the firing process to be not lower than 725° C. In this case, it is possible for the crystal growth to satisfactorily proceed. Although the highest temperature during the firing process is not particularly limited, the highest temperature should be generally about 850° C. to 900° C. at which the deterioration of the substrate can be sufficiently prevented.

In the present embodiment, it is desirable for the oxygen annealing treatment to be carried out at a temperature of 525° C. or lower. Incidentally, the oxygen annealing treatment can be carried out consecutively to the firing process by switching the atmosphere.

As described above, according to the method of this embodiment, it is possible to obtain the superconductor layer 7 exhibiting a high critical current density. The superconductor layer 7 can be used in various fields including, for example, a superconducting wire, a superconducting coil, a superconducting magnet, an MRI apparatus, a magnetically levitated train, and SMES. The superconductor layer 7 thus obtained exhibits features markedly differing from those exhibited by the superconductor layer obtained by the conventional method as described in the following.

In the superconductor layer 7 obtained by any of the method shown in FIGS. 2A to 2C and the method shown in FIGS. 3A to 3C, the crystal growth satisfactorily proceeds in the region about 50 nm or less from the surface of the substrate 1, and microcrystals such as CuO particles 4 are scarcely present in the particular region.

It should also be noted that, if the CuO particles 4 are taken into the oxide superconductor 6 during the process of the crystal growth of the oxide superconductor 6 in not only the method shown in FIGS. 3A to 3C but also the method shown in FIGS. 2A to 2C, the composition of the precursor 2 shown in FIGS. 2B and 3B is deviated from the stoichiometry. Where a sufficiently large amount of the quasi-liquid phase 5 is present in the edge portion of the growth of the oxide superconductor 6, the crystal growth of the oxide superconductor 6 satisfactorily proceeds. However, where the amount of the precursor 2 is deficient, the deviation of the composition from the stoichiometry is rendered large so as to make it impossible to form the quasi-liquid phase. As a result, metals other than Cu and compounds of these metals are precipitated. According to the method of the present embodiment, the particular precipitation is small at positions of the superconductor layer where the distance from the surface of the substrate 1 is 70% or less of the thickness of the superconductor layer 7.

If at least one of the cross sections of the superconductor layers 7 that is parallel with the substrate 1 and spaced apart from the substrate 1 by 50 nm to 70% of the thickness of the superconductor layer 7 is observed by, for example, a transmission electron microscope (TEM), it is clearly seen that the superconductor layer 7 obtained by the method of the present embodiment markedly differs from the superconductor layer obtained by the conventional method in the content of fine particles. To be more specific, in the superconductor layer obtained by the conventional method, the area ratio of the cross section of the fine particles to the cross section noted above is 1/50 or more. On the other hand, in the superconductor layer 7 obtained by the method according to the present embodiment, the area ratio of the cross section of the fine particles to the cross section noted above is 1/100 or less, and 1/1000 or less in the case where a particularly large critical current density can be obtained. Because of the particular feature, it is possible to judge whether or not the superconductor layer was manufactured by the method according to this embodiment. Incidentally, where the calcining process is carried out by the method according to the present embodiment such that the CuO particles within the precursor have an average diameter of 8.8 nm or larger, it is possible for the area ratio noted above to be 1/1000 or more depending on, for example, the conditions of the firing process.

The superconductor layer obtained by the method according to the present embodiment is featured as follows. Since the TFA-MOD method is utilized in this embodiment, the superconductor layer obtained by the method described above contains a trace of fluorine. In addition, where the superconductor layer obtained by the method of this embodiment contains copper oxide particles, oxide superconductor is present in an amount of at least 50% by volume in a region which surrounds the copper oxide particle and whose outer surface is away from a surface of the copper oxide particle by 0.1 μm.

It is possible to judge whether or not the superconductor layer was obtained by the method according to the present embodiment by looking into, for example, the features described above.

Examples of the present invention will now be described.

EXAMPLE 1

Each powder of hydrated $Y(OCOCH_3)_3$, $Ba(OCOCH_3)_2$ and hydrated $Cu(OCOCH_3)_2$ was dissolved in deionized water. Then, an equivalent molar of $CF_3COOH$ was added to each of the resultant solutions while stirring the solution, followed by mixing these solutions in the metal ion molar ratio of 1:2:3 so as to obtain a mixed solution. The mixed solution was poured into an eggplant type flask and the flask was set on a rotary evaporator so as to carry out the reaction and refining under a reduced pressure for 12 hours. As a result, a translucent blue gel or sol was obtained.

The gel or sol thus obtained was completely dissolved in methanol in an amount about 100 times as heavy as the gel or sol. The solution thus prepared was also subjected to the reaction and refining for 12 hours under a reduced pressure by using a rotary evaporator, thereby obtaining a translucent blue gel or sol. The gel or sol thus prepared was dissolved again in methanol, followed by diluting the resultant solution by using a measuring flask so as to obtain a coating solution with a concentration of 1.52M in metal ions.

Then, the (100) oriented $LaAlO_3$ substrate was coated with the coating solution by means of the spin coating. In performing the spin coating operation, the accelerating time was set at 0.4 second, the rotating speed was set at 4,000 rpm, and the rotation was kept for 120 seconds.

Next, a calcining process was applied under the atmospheric pressure to the coating film obtained by the spin coating operation. Then, a firing process was applied under the atmospheric pressure to the calcined coating film, followed by applying an annealing treatment to the fired coating film so as to obtain a superconductor layer.

Figure 4:
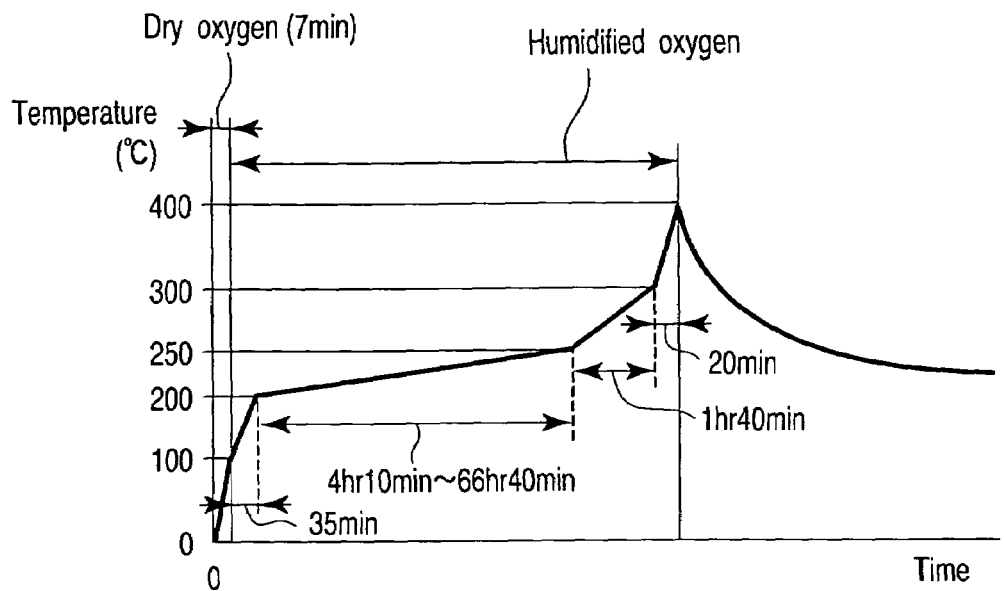
FIG. 4 is a graph showing the temperature profile of the calcining process carried out in Example 1.

FIG. 4 is a graph showing the temperature profile of the calcining process. In the graph of FIG. 4, the elapsed time from initiation of the heating is plotted on the abscissa, and the temperature of the atmosphere is plotted on the ordinate. In Example 1, the calcining process was carried out in a pure oxygen atmosphere for 7 minutes after initiation of the heating and, then, the calcining process was carried out in a humidified pure oxygen atmosphere containing 4.2% by volume of water vapor until the highest temperature of 400° C. was reached. Also, in Example 1, the time for elevating the temperature from 200° C. to 250° C. in the calcining process was changed within a range of 4 hours and 10 minutes to 66 hours and 40 minutes.

Figure 5:
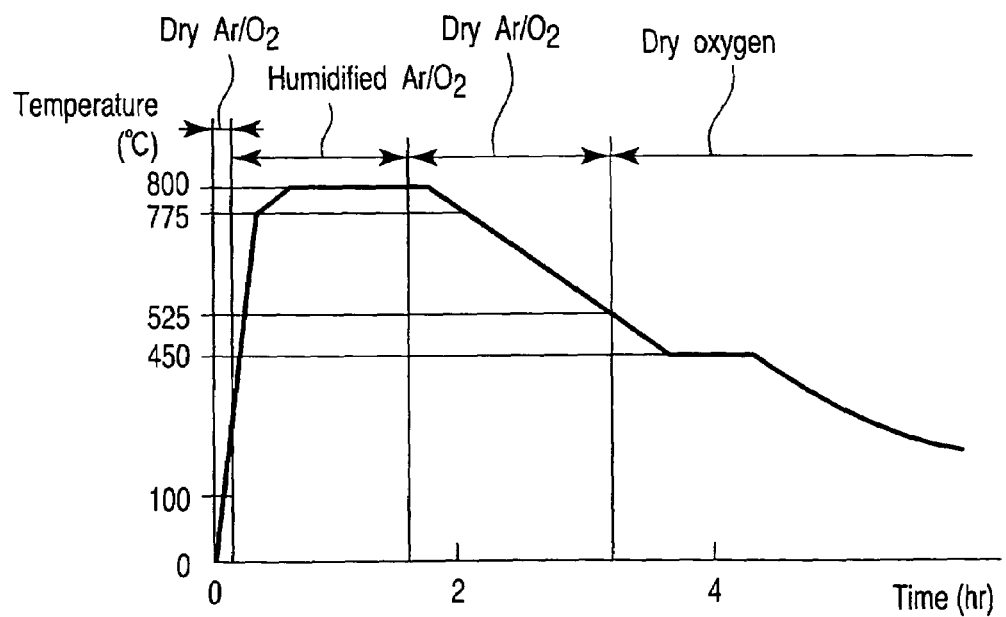
FIG. 5 is a graph showing the temperature profile of the firing process and the annealing carried out in Example 1.

FIG. 5 is a graph showing the temperature profile of the firing process and the annealing treatment carried out in Example 1. In the graph of FIG. 5, the elapsed time from initiation of the heating is plotted on the abscissa, and the temperature of the atmosphere is plotted on the ordinate. In this Example, the firing process and the annealing treatment were carried out in a dry atmosphere of argon containing 1000 ppm of oxygen in the initial stage of the heating. Then, the atmosphere was humidified at a rate of 4.2% by volume, followed by changing the atmosphere into a dry oxygen atmosphere.

In respect of each of the superconductor layers thus obtained, cross sections of the superconductor layer within a range between 50 nm and 100 nm from the surface of the substrate and parallel with the surface of the substrate was observed with a TEM. Also, a cross section of the superconductor layer perpendicular to the substrate was observed with a TEM in respect of the coating film after the calcining process and before the firing process. Further, in respect of each of the superconductor layers, Ic was measured by a DC four-probe method, and the thickness of the film was measured from the inductively coupled plasma (IPC) emission spectroscopy and the area of the sample piece.

Figure 6:
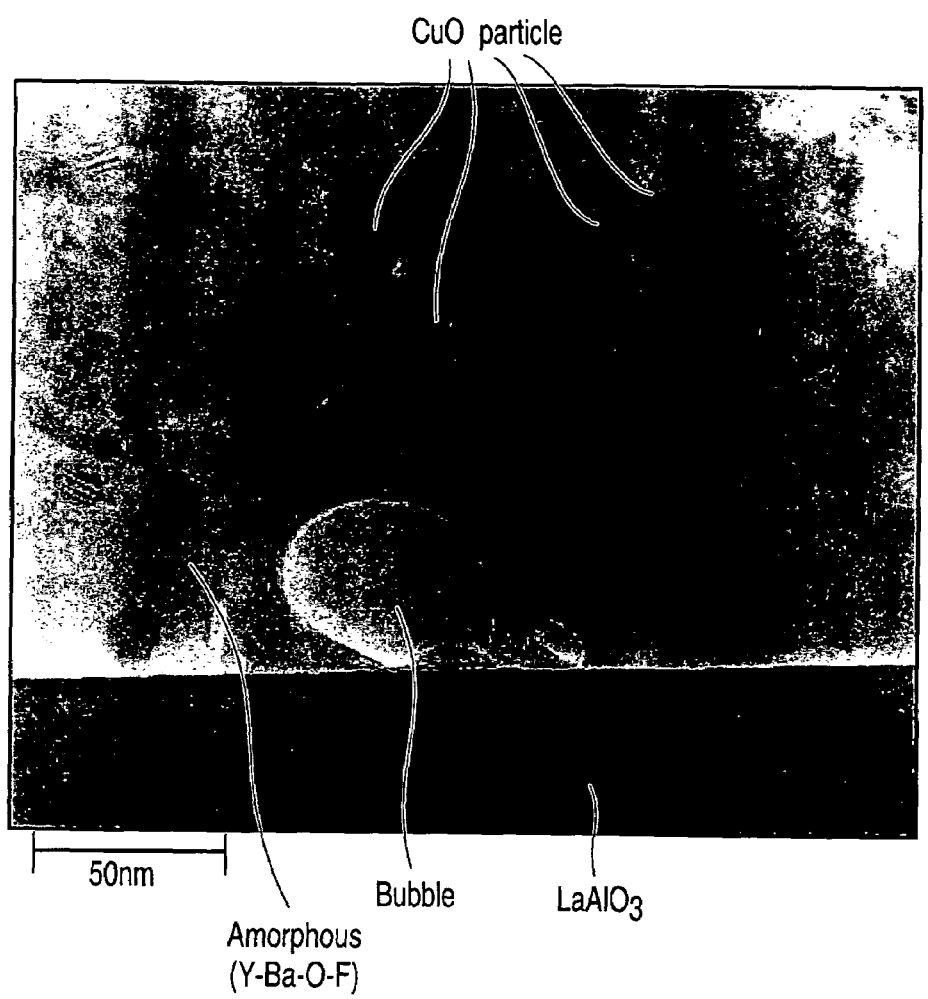
FIG. 6 is a cross sectional TEM micrograph showing a superconductor layer which was calcined at 200° C. to 250° C. for 16 hours and 40 minutes.
Figure 7:
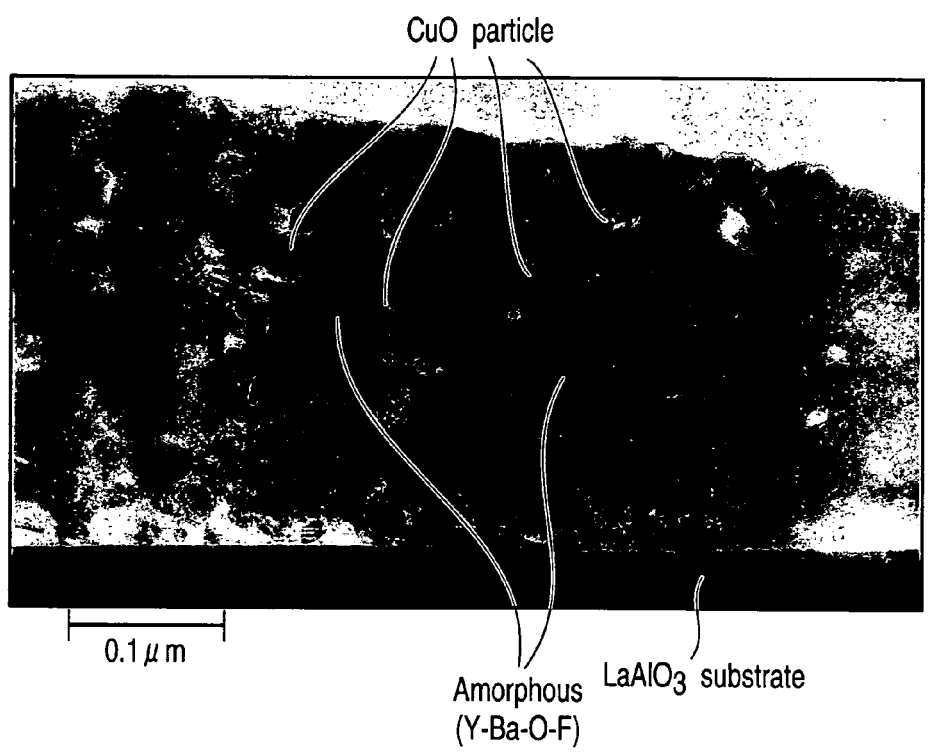
FIG. 7 is a cross sectional TEM micrograph showing a superconductor layer which was calcined at 200° C. to 250° C. for 66 hours and 40 minutes.

FIG. 6 is a cross sectional TEM micrograph showing a superconductor layer which was calcined at 200° C. to 250° C. for 16 hours and 40 minutes. On the other hand, FIG. 7 is a cross sectional TEM micrograph showing a superconductor layer which was calcined at 200° C. to 250° C. for 66 hours and 40 minutes. CuO particles were observed in the fired coating film in each of these TEM micrographs. Also, it was confirmed from the EDS analysis of TEM that the other portion is made of an amorphous matrix mainly containing Y, Ba, O and F and partially containing the Cu content. Incidentally, particles other than the CuO particles were not recognized in the calcined coating films. The reason for this is that the impurities were eliminated by highly purifying the solution.

The average diameters of the CuO particles and the standard deviations thereof, which were obtained from the TEM micrographs shown in FIGS. 6 and 7, are shown in the table given below:

| Calcining | CuO particle | |
|---|---|---|
| condition (Duration at 200° C. to 250° C.) | Average particle diameter (nm) | Standard deviation for particle diameter (nm) |
| 16 hr 40 min | 14.0 | 1.33 |
| 66 hr 40 min | 23.7 | 6.56 |

As described above, it is presumed that copper trifuluoroacetate starts partial-hydrolysis and oxidation thereof, which produce CuO, prior to the other salts start partial-hydrolysis and oxidation thereof, and the latter salts produce the amorphous matrix. Within the temperature range of 200° C. to 250° C. during the calcining process, the CuO particles are considered to continue to grow with the reduction of the surface energy utilized as the driving force. In other words, the growth of the CuO particles is considered to obey the Ostwald's growth or the growing mechanism close thereto. The experimental data indicated in the table given above represent the result well conforming with the Ostwald's growth. It follows that the particle diameter of the CuO particle is considered to monotonically increase in accordance with the time during which the temperature of the atmosphere is kept at 200° C. to 250° C. in the calcining process.

Figure 8:
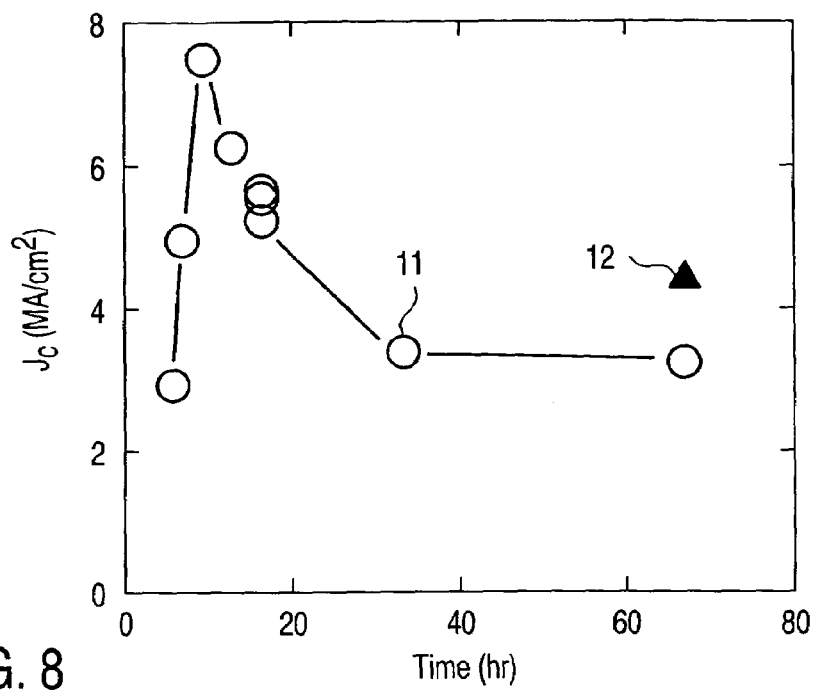
FIG. 8 is a graph showing the relationship between the calcining condition and $J_c$ of the superconductor layers obtained in example 1.

FIG. 8 is a graph showing the relationship between the calcining condition and the critical current density $J_c$ of the superconductor layer obtained in Example 1. In the graph of FIG. 8, the time during which the temperature of the atmosphere was kept at 200° C. to 250° C. in the calcining process is plotted on the abscissa, and the critical current density $J_c$ is plotted on the ordinate. Also, a reference numeral 11 shown in FIG. 8 denotes the data obtained in Example 1, and a reference numeral 12 denotes the data obtained in Example 2 described herein later.

As denoted by the reference numeral 11 in FIG. 8, a high critical current density $J_c$ was obtained in the case where the time during which the temperature of the atmosphere was kept at 200° C. to 250° C. in the calcining process was set within a range of 6 hours and 15 minutes to 16 hours and 30 minutes. The reason for this is that the decomposition of the trifluoroacetate sufficiently progressed and the growth of the CuO particles was sufficiently suppressed.

Figure 9:
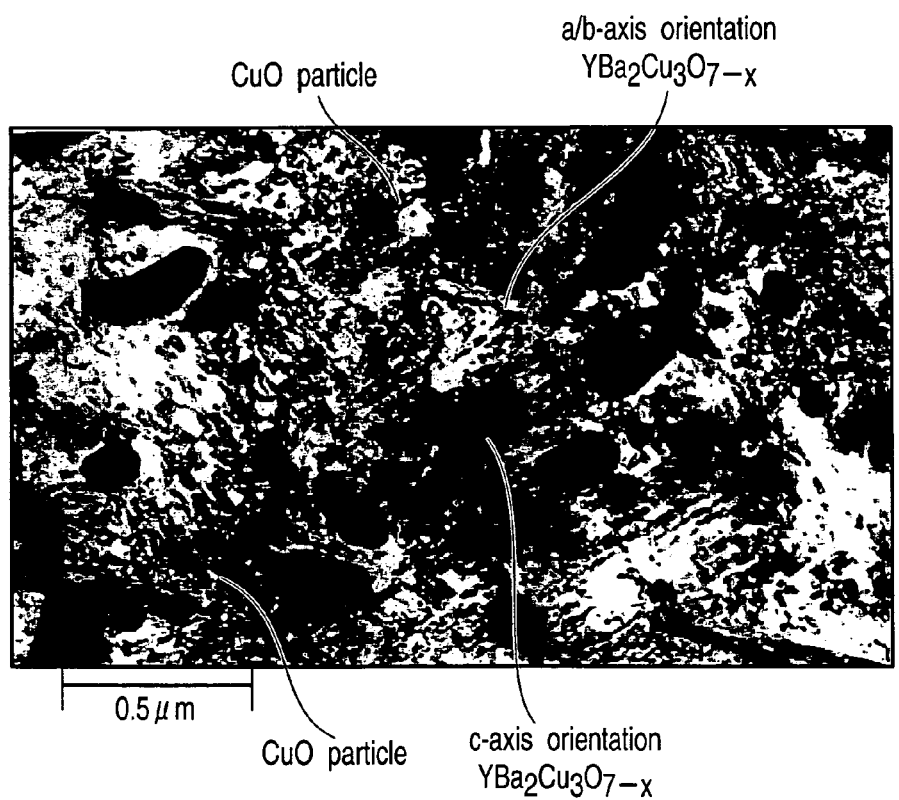
FIG. 9 is a TEM micrograph showing a superconductor layer which was calcined at 200° C. to 250° C. for 66 hours and 40 minutes.

FIG. 9 is a TEM micrograph showing a superconductor layer which was kept at 200° C. to 250° C. for 66 hours and 40 minutes in the calcining process. The TEM micrograph shows a cross section having the smallest number of CuO particles among the cross sections of the superconductor layer that are spaced apart from the substrate by 50 nm to 100 nm and are parallel with the substrate surface. The area ratio of the CuO particles to the superconductor layer was about 1/200 in the cross section shown in FIG. 9 and fell within a range of 1/50 to 1/200 in the other cross sections.

Similarly examined was the TEM micrograph of the superconductor layer kept at 200° C. to 250° C. for 16 hours and 40 minutes during the calcining process. The area ratio noted above was found to fall within a range of 1/80 to 1/400. Also, the area ratio of the CuO particles to the superconductor layer was found to be 1/100 or less in all the cross sections in the case where the superconductor layer was kept at 200° C. to 250° C. for 13 hours and 43 minutes in the calcining process. Further, the area ratio noted above was 1/1000 or less in all the cross sections in the case where the superconductor layer was kept at the temperature noted above for 9 hours and 43 minutes. In the case of using a LaAlO$_3$ single crystal substrate, it was possible to obtain a critical current density of 7 to 8 MA/cm$^2$ (77K, 0T). Also, in the case of using a CeO$_2$/YSZ substrate free from the generation problem of particles oriented in the a/b axis, it was possible to obtain a critical current density $J_c$ of 10 to 12 MA/cm$^2$ (77K, 0T). Incidentally, the superconductor layers had a thickness of 150 to 320 nm.

Figure 10:
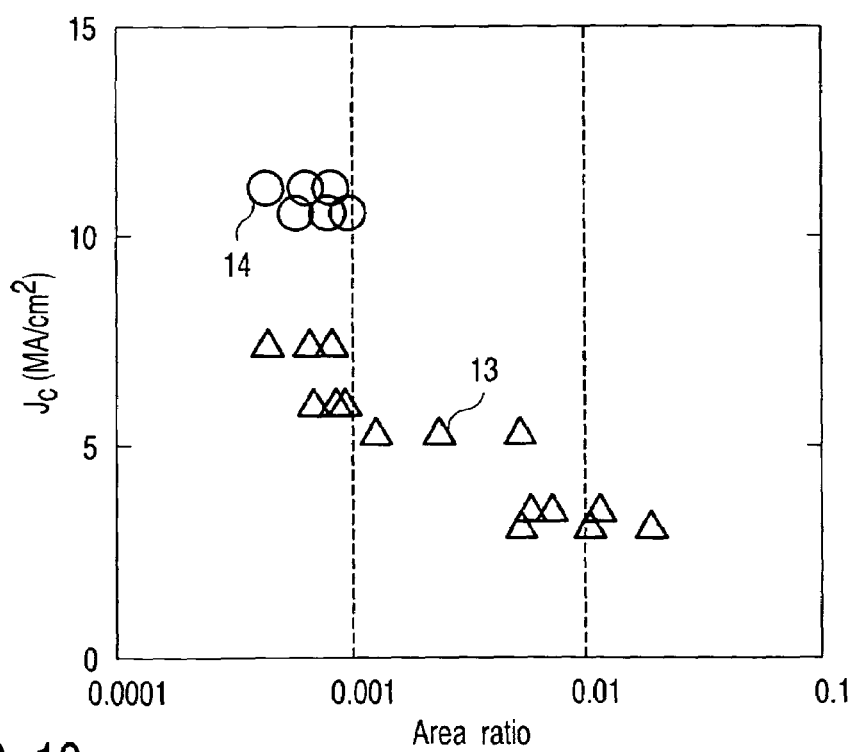
FIG. 10 is a graph showing the relationship between the amount of CuO particles present in the superconductor layer and the critical current density $J_c$.

FIG. 10 is a graph showing the relationship between the amount of the CuO particles present in the superconductor layer and the critical current density $J_c$. In the graph of FIG. 10, plotted on the abscissa is the area ratio of the CuO particles to the superconductor layer in a cross section of the superconductor layer that is spaced apart from the substrate by 50 nm to 100 nm and is parallel with the substrate surface, and the critical current density $J_c$ is plotted on the ordinate. A reference numeral 13 shown in FIG. 10 denotes the data obtained in the case of using the LaAlO$_3$ substrate, and a reference numeral 14 denotes the data obtained in the case of using the CeO$_2$/YSZ substrate. As shown in FIG. 10, the superconductor layer having the above-noted area ratio of 1/100 or less exhibited good properties, and the superconductor layer having the area ratio of 1/1000 or less exhibited superior properties.

EXAMPLE 2

A superconductor layer having a thickness of 150 nm was formed as in Example 1, except that the atmosphere was kept at 200° C. to 250° C. for 66 hours and 40 minutes in the calcining process, and that the water vapor content of the humidified Ar/O$_2$ atmosphere in the firing process was set at 12.1% by volume. Cross sections of the superconductor layer that are spaced apart from the substrate by 50 nm to 100 nm and parallel with the substrate surface were observed with a TEM. As a result, the area ratio of the CuO particles to the superconductor layer was 1/60 to 1/250 in these cross sections.

Also, the critical current density $J_c$ was measured for this superconductor layer, with the result as shown in FIG. 8. As denoted by a reference numeral 12 in FIG. 8, it was possible to obtain a higher critical current density $J_c$, compared with the case where the superconductor layer was formed under the same conditions, except that the water vapor concentration in the humidified Ar/O$_2$ atmosphere in the firing process was set at 4.2% by volume.

The technique described above carries out the calcining process of the TFA-MOD method such that the average diameter of the copper oxide particles contained in the calcined coating film falls within a prescribed range. In this case, the CuO particles can be sufficiently converted into the superconductor by carrying out the firing process in a sufficiently humidified atmosphere so as to realize a high critical current density. In other words, it becomes possible to manufacture a superconductor layer with high critical current density by the TFA-MOD method.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general invention concept as defined by the appended claims and their equivalents.

What is claimed is:

1. A superconductor layer formed on a main surface of a substrate, comprising an oxide superconductor that contains barium, copper, oxygen, and at least one metal selected from the group consisting of yittrium and lanthanoids, wherein, when a cross section of the superconductor layer that is parallel with the main surface and spaced apart from the main surface by 50 nm or more and 70% or less of a thickness of the superconductor layer is observed, an area ratio of copper oxide particles to the superconductor layer is 1/1000 or less.

2. The superconductor layer according to claim 1, further comprising fluorine.

3. The superconductor layer according to claim 1, wherein the oxide superconductor contains at least one metal selected from the group consisting of samarium, europium, gadolinium, terbium, dysprosium, holmium, erbium, and thulium.

4. The superconductor layer according to claim 1, further comprising fluorine, wherein the oxide superconductor contains at least one metal selected from the group consisting of samarium, europium, gadolinium, terbium, dysprosium, holmium, erbium, and thulium.

5. The superconductor layer according to claim 1, wherein the superconductor layer contains copper oxide particles, and the oxide superconductor is present in an amount of at least 50% by volume in a region of the superconductor layer, the region surrounding the copper oxide particles and an outer surface of the region being located away from a surface of the copper oxide particles by 0.1 μm.

6. The superconductor layer according to claim 2, wherein the superconductor layer contains copper oxide particles, and the oxide superconductor is present in an amount of at least 50% by volume in a region of the superconductor layer, the region surrounding the copper oxide particles and an outer surface of the region being located away from a surface of the copper oxide particles by 0.1 μm.

7. The superconductor layer according to claim 3, wherein the superconductor layer contains copper oxide particles, and the oxide superconductor is present in an amount of at least 50% by volume in a region of the superconductor layer, the region surrounding the copper oxide particles and an outer surface of the region being located away from a surface of the copper oxide particles by 0.1 μm.

8. The superconductor layer according to claim 4, wherein the superconductor layer contains copper oxide particles, and the oxide superconductor is present in an amount of at least 50% by volume in a region of the superconductor layer, the region surrounding the copper oxide particles and an outer surface of the region being located away from a surface of the copper oxide particles by 0.1 μm.

* * * * *